United States Patent [19]

Yamamoto et al.

[11] Patent Number: 4,713,556
[45] Date of Patent: Dec. 15, 1987

[54] FREQUENCY CONVERTER CIRCUIT

[75] Inventors: Akio Yamamoto; Keiro Shinkawa, both of Yokohama, Japan

[73] Assignee: Hitachi, Ltd., Tokyo, Japan

[21] Appl. No.: 798,241

[22] Filed: Nov. 8, 1985

[30] Foreign Application Priority Data

Nov. 9, 1984 [JP] Japan ................. 59-235093

[51] Int. Cl.$^4$ .............. H03B 19/00; H03B 5/00
[52] U.S. Cl. ................. 307/219.1; 307/529; 331/117 R; 331/43; 328/15
[58] Field of Search ............ 307/219.1, 271, 320, 307/529; 328/15; 331/43, 117 R, 47, 51, 108 R; 332/9 T, 16 T; 455/118, 323, 333

[56] References Cited

U.S. PATENT DOCUMENTS

| | | | |
|---|---|---|---|
| 3,305,730 | 2/1967 | Parzen | 307/529 |
| 3,716,730 | 2/1973 | Cerny, Jr. | 307/529 |
| 3,889,210 | 6/1975 | Matsuura et al. | 331/117 R |
| 4,160,953 | 6/1979 | Matsuura et al. | 455/333 |
| 4,380,827 | 4/1983 | Moon | 455/318 |
| 4,581,768 | 4/1986 | Aoki et al. | 455/333 |
| 4,593,255 | 6/1986 | Matsuura | 333/117 R |
| 4,593,257 | 6/1986 | Wignot | 333/117 R |

Primary Examiner—Stanley D. Miller
Assistant Examiner—Timothy P. Callahan
Attorney, Agent, or Firm—Antonelli, Terry & Wands

[57] ABSTRACT

A frequency converter circuit for converting a high-frequency signal into an intermediate-frequency signal includes a local oscillation with a first transistor having first, second and third terminals. A first terminal of the first transistor is grounded through a first inductance and a first capacitor, while a second capacitor is inserted between the other two terminals. A resonance circuit including variable-capacity diodes and a second inductance is connected to the second terminal through a third capacitor. The frequency converter circuit further includes a mixer formed with a second transistor having a base thereof connected to the grounded terminal of the first transistor and an emitter thereof grounded through impedances offering substantially no resistance to the intermediate-frequency signal. The emitter of this second transistor is connected to a high-frequency input terminal supplied with a high-frequency signal. The intermediate frequency output is taken from the collector of the second transistor, preferably through a low-pass filter.

14 Claims, 7 Drawing Figures

FREQUENCY CONVERTER CIRCUIT

BACKGROUND OF THE INVENTION

The present invention relates generally to a frequency converter circuit comprising a high-frequency oscillator, a buffer amplifier and a mixer for converting a high-frequency signal into an intermediate-frequency signal.

In a satellite broadcast receiving system, a signal of 12 GHz band is received by a parabolic antenna, and down-converted into a signal of 1 GHz band by an outdoor unit. This signal is further converted into a 400 MHz signal by an indoor unit. The present invention provides a frequency converter circuit suitably used for applications of converting the above-mentioned signal of 1 GHz band into a signal of 400 MHz.

A typical conventional frequency converter circuit for converting a high frequency into an intermediate frequency is disclosed in Japanese Patent Unexamined Publication No. 179005/83.

Such a frequency converter circuit comprises a collector-grounded transistor oscillator and a mixer including two diodes, in which an oscillation frequency is applied from an inductor of a resonance circuit of the oscillator by inductive coupling to the mixer circuit.

Generally, in a frequency converter circuit, the oscillation power applied to a mixer is recovered by inductive coupling as described above, and if a large power sufficient to secure satisfactory mixer operation is to be obtained, a buffer transistor is used with a closer inductive coupling. The output of this inductive coupling changes the resonance impedance, thus easily causing such an abnormal oscillation as an oscillation skip or oscillation stop. Further, if the oscillation circuit is variable over a broad band to make possible broad-band receiving, the resonance characteristic of the inductive coupling circuit becomes conspicuous, thereby causing a large frequency deviation of the oscillation power applied to the mixer (that is, a large variation of the oscillation power with frequency), resulting in a large frequency deviation of the frequency conversion characteristic of the mixer.

Since the conversion loss of the mixer circuit is great, on the other hand, it is necessary to arrange amplifiers in multiple stages after the mixer.

Furthermore, the buffer transistor requires large power for driving the mixer with large oscillation power, thereby leading to the disadvantage of a large leakage of the oscillation power of the mixer to the signal input terminal thereof.

SUMMARY OF THE INVENTION

The object of the present invention is to provide a frequency converter circuit in which a high-frequency oscillation circuit is unlikely to cause an abnormal oscillation nor the oscillation power develop a large frequency deviation even when the oscillation circuit is made variable over a broad band, with the result that a large frequency deviation does not occur in the frequency conversion characteristic of the mixer, while the conversion loss and the leakage of the oscillation power to the signal input terminal are kept small in the mixer circuit.

According to the present invention, the base of a base-grounded oscillation transistor, the emitter of an emitter-grounded oscillation transistor or the collector of a collector-grounded transistor is directly connected to the base of a buffer transistor functioning as a frequency converter to take out the oscillation power directly to the buffer transistor, while a high-frequency signal is applied from the emitter of the buffer transistor with an intermediate frequency signal taken out of the collector thereof, thereby realizing a compact frequency converter circuit low in power consumption and having stable oscillation and frequency conversion characteristics.

BRIEF DESCRIPTION OF THE DRAWINGS

The above and other objects, features and advantages of the present invention will be apparent from the following detailed description of the preferred embodiments thereof taken conjunction with the accompanying drawings, in which.

DESCRIPTION OF THE PREFERRED EMBODIMENTS

Figure 1:
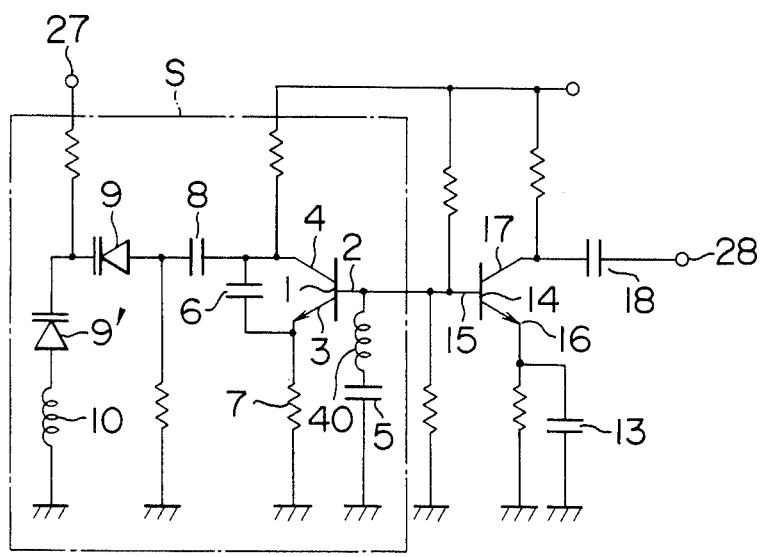
FIG. 1 is a diagram showing a basic circuit of the present invention.

In FIG. 1, a circuit portion S surrounded by a dashed line indicates an oscillation circuit, the oscillation output of which is taken out from the base 2 of an oscillation transistor 1 to the base 15 of an output buffer transistor 14.

The base 2 of the oscillation transistor 1 is grounded via an inductance 40 and a capacitor 5, thereby keeping the impedance of the base 2 low. A feedback capacitor 6 is inserted between the emitter 3 and the collector 4, and the collector 4 is connected through a capacitor 8 to a resonance circuit including variable-capicity diodes 9, 9' and an inductance 10. Reference numeral 7 designates a bias resistor.

The oscillation frequency is changed by changing the bias voltage applied from a terminal 27 to the variable-capacity diodes 9, 9'. A satisfactory oscillation and mixing operation is possible with the inductance 40 of a value from 1 nH to 3 nH and the capacitor 5 of 20 PF or more.

If the base 2 of the transistor 1 is connected directly with the base 15 of the output buffer transistor 14, it is possible to take out from the terminal 28 a large oscillation output with a small band deviation of the oscillation power without affecting the oscillation characteristic of the oscillation circuit S.

Numeral 16 designates the emitter of the output buffer transistor 14, numeral 17 of collector of the same, numeral 18 a coupling capacitor, and numeral 13 a grounding capacitor.

Figure 2:
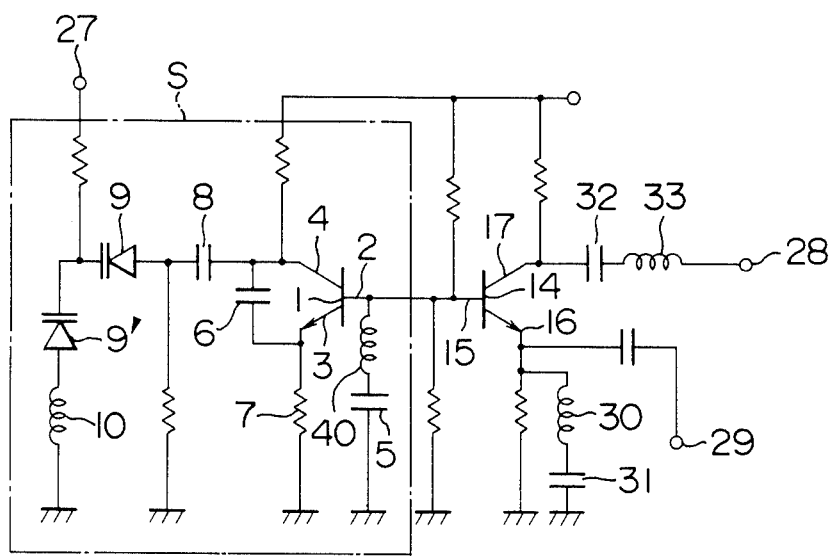
FIG. 2 is a circuit diagram showing an embodiment of the present invention.

A circuit showing an embodiment of the present invention configured on the basis of the basic circuit of FIG. 1 is illustrated in FIG. 2.

In the shown embodiment, the buffer transistor 14 directly connected to the oscillation transistor 1 through the bases 2 and 15 thereof is used as a frequency converter circuit in such a manner that the emitter 16 is impressed with a high frequency signal through the terminal 29 and mixed with the oscillation power applied from base 15 thereby to produce an intermediate frequency signal from the collector 17.

The emitter 16 of the buffer transistor 14 is connected with a series resonant circuit including an inductance 30 and a capacitor 31 to ground the intermediate frequency. The collector 17 is connected with a low-pass filter 33 to provide an open impedance against the oscillation frequency and the high frequency signal frequency.

In this curciut, the inductance 40 connected to the base 2 of the oscillation transistor 1 is utilized to connect the base 15 of the buffer transistor 14 directly to the base 2 of the oscillation transistor 1, and therefore the oscillation power with small band deviation is applied efficiently to the base 15, thereby attaining a superior frequency conversion characteristic.

Figure 3:
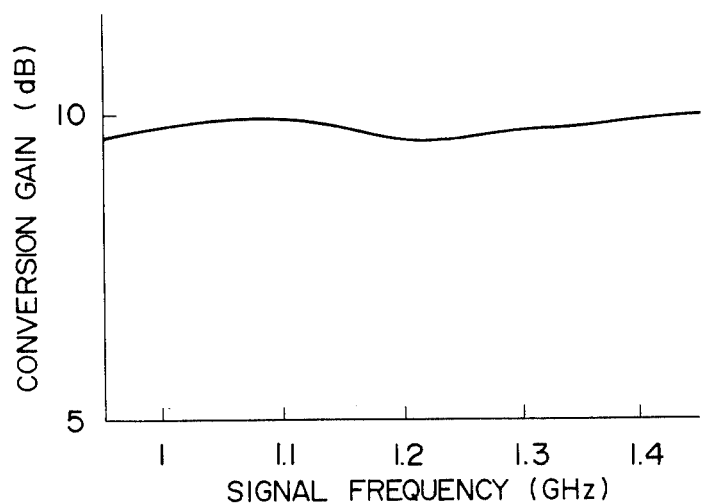
FIG. 3 is a graph showing a conversion gain characteristic of a first embodiment of the present invention in the 1 GHz band.

FIG. 3 is a graph showing the conversion gain characteristic in 1 GHz band according to the embodiment shown in FIG. 2.

In FIG. 3, the abscissa represents the signal frequency of a high frequency signal applied from the terminal 29 in FIG. 1, and the ordinate the conversion gain.

The graph of FIG. 2 shows the characteristic with the oscillation frequency of 1.35 to 1.85 GHz, the signal frequency of 0.95 to 1.45 GHz of the high frequency signal applied from the terminal 29, the intermediate frequency of 400 MHz of the intermediate frequency signal take out of the terminal 28, and the power of $-2$ dBm applied from the oscillation circuit over the entire oscillation bandwidth, indicating a superior conversion gain characteristic at almost 10 dB with small band deviation.

The applied oscillation power is as small as $-2$ dBm, and therefore less oscillation power leaks to the high frequency signal input terminal 29 of the emitter 16. In addition, since this emitter 16 provides a high impedance against the oscillation frequency and the high harmonics thereof, the transistor 14 has no gain, thereby keeping the oscillation power leak at low level.

On the other hand, the buffer transistor 14 driven as mixer transistor uses the emitter current as a small current for the purpose of improving the conversion gain by taking advantage of the non-linear characteristic of the PN junction of the base 15 and emitter 16, thereby saving the power consumption.

As described above, according to an embodiment of the present invention shown in FIG. 1, the base 2 of the oscillation transistor 1 is directly connected to the base 15 of the buffer transistor 14 on the one hand, and the buffer transistor 14 is driven as a mixer transistor on the other hand, thereby making possible a stable oscillating operation, a superior conversion characteristic, a very compact circuit, a reduced power consumption and a smaller leakage of the oscillation power to the input terminal side.

An embodiment of the present invention was explained above with reference to the case in which a base-grounded oscillation circuit. It is apparent, however, that the present invention is not limited to such base-grounded oscillation circuit but the same effect is obtained by use of a collector-grounded oscillation circuit or an emitter-grounded oscillation circuit.

Figure 4:
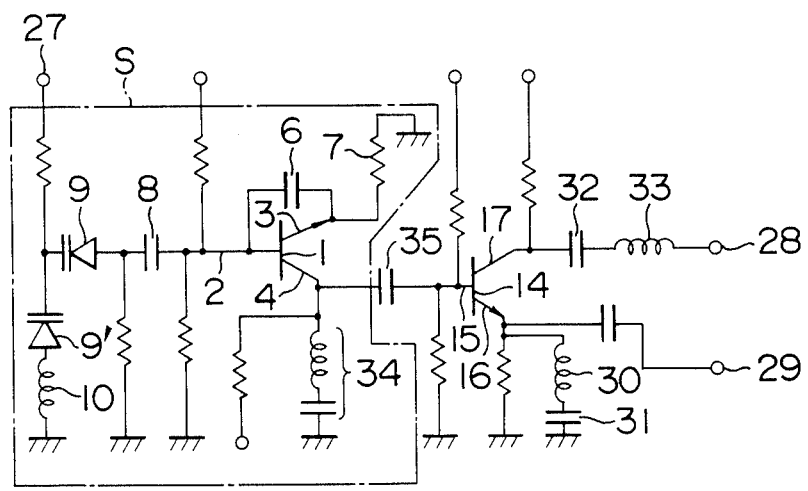
FIGS. 4 and 5 are diagrams showing circuits of a second and third embodiments of the present invention.

FIG. 4 shows an embodiment using a collector-grounded oscillation circuit as the oscillation circuit S.

In FIG. 4, the collector 4 of an oscillation transistor 1 is grounded through a chip capacitor 34. As shown, the electrode of the chip capacitor has an inductance. The oscillation power taken out of the collector 4 is applied to the buffer transistor 14 from the base 15 directly connected in high-frequency fashion through the capacitor 35 and the collector 4.

Figure 6:
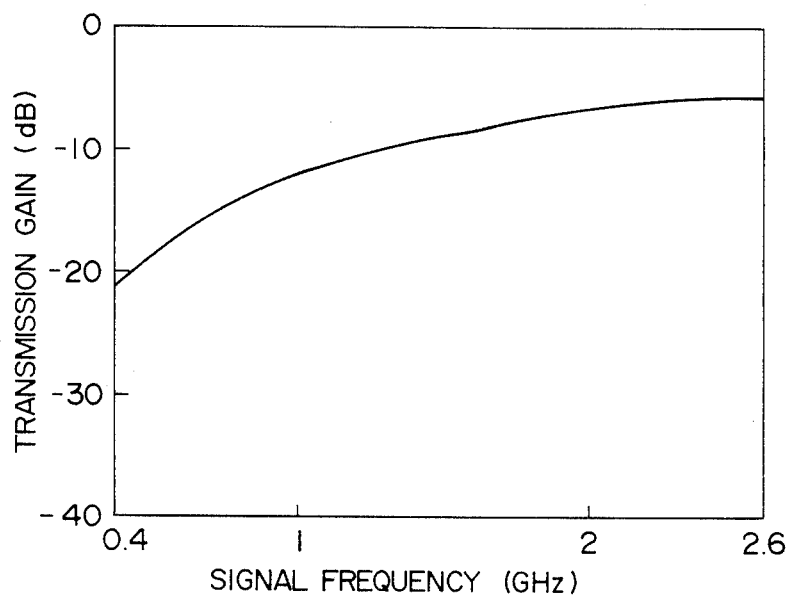
FIG. 6 is a graph showing the attenuation characteristic of a high-frequency capacitor according to the present invention.

A graph showing the attenuation characteristic of the high-frequency chip capacitor is shown in FIG. 6, and represents the passing characteristic with a 50Ω line grounded by a chip capacitor charged with 1000 pF, that is, the frequency characteristic of transmission gain.

A chip capacitor of 4000 pF has an impedance of 0.2Ω or less at the frequency of 1 GHz or more, and is ideally attenuated by 25 dB or more. Actually, however, the equivalent resistance of about 1.5Ω of the inductance of the electrode of the chip capacitor develops an attenuation of about 8 dB to 10 dB as shown in the graph of FIG. 6.

It is also seen from the same graph that the amount of attenuation decreases with the increase in frequency. This is by reason of the fact that the self-resonance frequency due to the capacity of the chip capacitor and the inductance of the electrode is in a low frequency band of 1 GHz or less, while the inductance of the electrode operates as a small inductance at 1 GHz or more. The impedance of this chip capacitor is sufficient for the oscillator as a grounding impedance thereof. By taking advantage of this attenuation characteristic of the chip capacitor against the high frequency signal, the base of the oscillator transistor grounded through this capacitor is directly connected to the base of a buffer transistor to make a configuration in which an oscillation output can be taken out from the oscillation transistor side to the buffer transistor side without affecting the oscillation characteristic.

Figure 5:
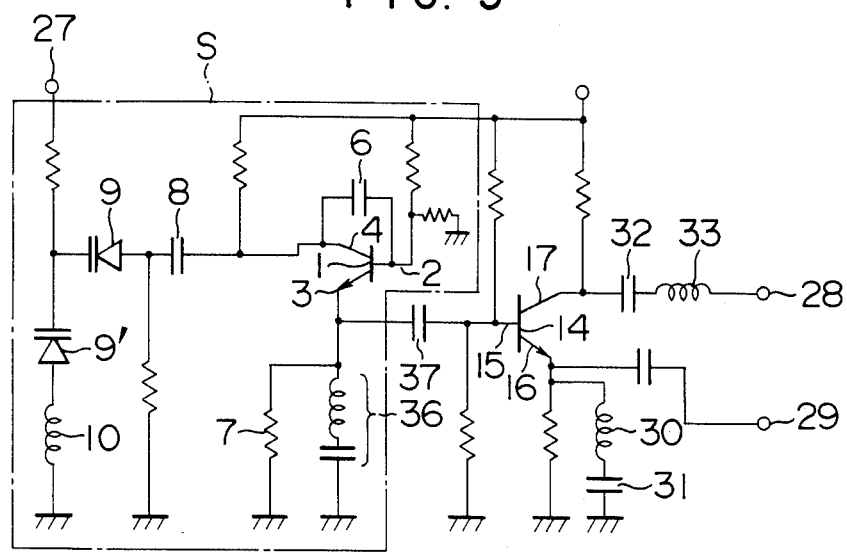

An embodiment using an emitter-grounded oscillation circuit as the oscillation circuit S is shown in FIG. 5.

An emitter 3 is grounded through a chip capacitor 34, and the emitter 3 is connected in high frequency fashion to the base 15 of a buffer transistor 14 through a capacitor 37.

Both the embodiments of FIGS. 4 and 5 are configured in a manner to apply the oscillation power directly to the base of the base of a buffer transistor from a grounding terminal, thereby attaining the same effect as described with reference to the embodiment using a base-grounded oscillation circuit.

Figure 7:
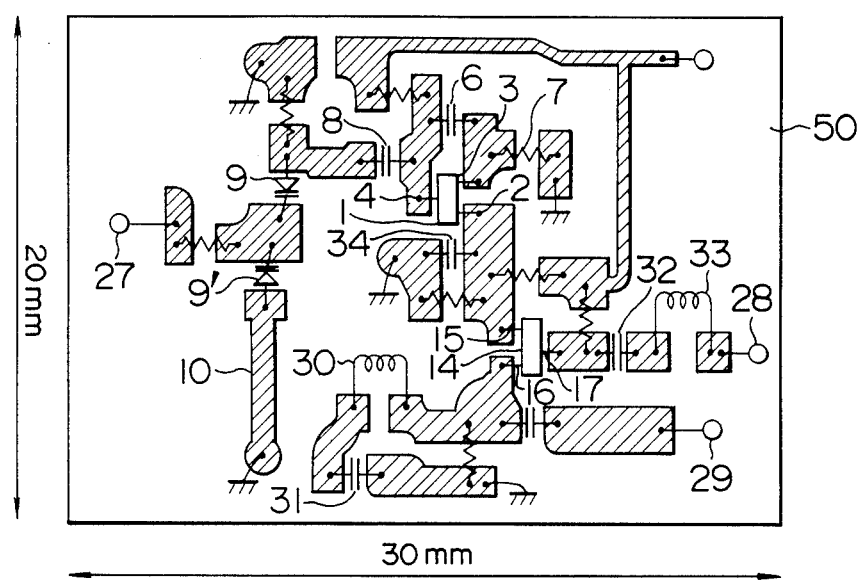
FIG. 7 is a plan view showing a connection pattern on a printed wiring board used in the circuit according to the present invention.

FIG. 7 is a diagram showing a wiring pattern of a printed wiring board 50 used in the circuit of the first embodiment of FIG. 2. In this circuit, however, a chip capacitor 34 is used as the inductance 40 and the capacitor 5. Although a wiring pattern used in the circuit of the first embodiment alone was disclosed above, it will be obvious to those skilled in the art that a wiring pattern for the second and third embodiments is also obtainable by correcting the wiring pattern shown in FIG. 7.

It will be understood from the foregoing description that according to the present invention, there is provided a frequency converter circuit in which the base (or collector or emitter) of an oscillation transistor reduced in impedance by a capacitor is directly connected with the base of a buffer transistor, and a high-frequency signal is applied from the emitter of the buffer transistor to produce a stable intermediate frequency signal with small band deviation from the collector thereof, while attaining a high conversion gain, a greatly reduced circuit size, a smaller number of component parts and lesser power consumption.

We claim:

1. A frequency converter circuit for converting a high-frequency signal into an intermediate frequency signal, comprising:

a local oscillation circuit including:

a first transistor having first, second and third terminals, said first terminal of said first transistor being coupled to ground through a first inductance and a first capacitor, a second capacitor connected between said second and third terminals, and a resonance circuit having variable-capacity diodes and a second inductance, said resonance circuit being connected to said second terminal of said first transistor through a third capacitor; and a mixer circuit including:

a second transistor having a base connected to said first terminal of said first transistor so that an oscillation frequency signal is supplied from said first terminal of said first transistor to a base of said second transistor, said second transistor further comprising an emitter connected to a high frequency signal inputting terminal for inputting a high frequency signal to said second transistor, wherein said collector of said second transistor outputs an intermediate frequency signal which intermediate frequency signal is the difference signal between said oscillation frequency signal applied to the base of said second transistor and said high frequency signal applied to said emitter of said second transistor, and further wherein the emitter of said second transistor is connected to ground through impedances which substantially become zero with respect to said intermediate frequency signal.

2. A frequency converter circuit according to claim 1, wherein said first inductance and said first capacitor comprise a high frequency chip capacitor.

3. A frequency converter circuit according to claim 1, wherein said first terminal of said first transistor is the base thereof.

4. A frequency converter circuit according to claim 1, wherein said first terminal of said first transistor is the collector thereof.

5. A frequency converter circuit according to claim 1, wherein said first terminal of said first transistor is the emitter thereof.

6. A frequency converter circuit according to claim 1 or 3, wherein said second terminal of said first transistor is the collector thereof.

7. A frequency converter circuit according to claim 1 or 3, wherein said second terminal of said first transistor is the emitter thereof.

8. A frequency converter circuit according to claim 1 or 4, wherein said second terminal of said first transistor is the base thereof.

9. A frequency converter circuit according to claim 1 or 4, wherein said second terminal of said first transistor is the emitter thereof.

10. A frequency converter circuit according to claim 1 or 5, wherein said second terminal of said first transistor is the base thereof.

11. A frequency converter circuit according to claim 1 or 5, wherein said second terminal of said first transistor is the collector thereof.

12. A frequency converter circuit according to claim 1, wherein said frequency converter circuit is formed by using a wiring pattern of a printed wiring board.

13. A frequency converter circuit according to claim 1, wherein said first inductance is not less than 1 nH and not more then 3 nH, and said first capacitor has a value of not less than 20 PF.

14. A frequency converter circuit according to claim 1, wherein a low-pass filter is coupled to the collector of said second transistor so that said intermediate frequency signal is output from said mixer circuit through said low-pass filter.

* * * * *